United States Patent [19]

Gilbert

[11] Patent Number: 5,043,675

[45] Date of Patent: Aug. 27, 1991

[54] DIFFERENCE AMPLIFIER EMPLOYING INPUT ATTENUATOR NETWORK AND POWERED BY A SINGLE POLARITY POWER SUPPLY

[75] Inventor: Barrie Gilbert, Portland, Oreg.

[73] Assignee: Analog Devices, Inc., Norwood, Mass.

[21] Appl. No.: 439,453

[22] Filed: Nov. 20, 1989

[51] Int. Cl.[5] .............................................. H03F 3/45
[52] U.S. Cl. .................................... 330/258; 330/261
[58] Field of Search ................. 330/69, 252, 258, 261, 330/284, 296, 310

[56] References Cited

U.S. PATENT DOCUMENTS 3,530,395 9/1970 Prusha ............................ 330/258 X
3,832,646 8/1974 Szabó et al. ......................... 330/258

*Primary Examiner*—Steven Mottola
*Attorney, Agent, or Firm*—Wolf, Greenfield & Sacks

[57] ABSTRACT

The apparatus includes an operational amplifier which has inverting and non-inverting inputs and an output that is a function of the voltage at the inverting and non-inverting inputs. An attenuator network is connected to the operational amplifier. The attenuator network includes circuitry for reducing a voltage of a first value at the inputs of the attenuator network to a voltage that is a fraction of the first value at the output of the attenuator network which voltage is then transmitted to the operational amplifier inputs. The attenuator network includes additional circuitry for reducing a common-mode feed-through voltage of a second value at the inputs of the attenuator network to a common-mode feed-through voltage that is a fraction of the second voltage at the output of the operational amplifier.

15 Claims, 4 Drawing Sheets

DIFFERENCE AMPLIFIER EMPLOYING INPUT ATTENUATOR NETWORK AND POWERED BY A SINGLE POLARITY POWER SUPPLY

BACKGROUND OF THE INVENTION

1. Field of the Invention

The present invention relates generally to the field of difference amplifiers. More particularly, the present invention relates to a difference amplifier apparatus using operational amplifiers powered by single polarity power supplies, wherein the difference amplifier apparatus has a reduced common-mode response, even when the common-mode signal applied to the input of the difference amplifier is much larger than the differential signal applied to the input of the difference amplifier and much larger than the supply voltage to the amplifier.

2. Discussion of the Prior Art

Difference amplifiers are designed to measure the difference between two voltages applied to the respective inputs of the difference amplifier and to generate an output voltage which is proportional to the difference between the input voltages. The input signal which represents the difference between the two voltages applied at the respective inputs to the difference amplifier is called the differential mode signal. While to being responsive to the differential mode signal, an ideal difference amplifier has no response when the voltage on each respective input terminal is the same, even when this voltage is relatively large. That is, a difference amplifier should have no response when there is no difference between the input voltages. A signal applied to the input of the difference amplifier when both voltages at the respective inputs to the difference amplifier are the same, is called the common-mode signal.

A prior art implementation of a difference amplifier is shown in FIG. 1. An op-amp 12 is used which has infinite open loop gain for most practical purposes. Whenever the term op-amp or operational amplifier is used hereinafter the amplifier meant is of this type having essentially infinite open loop gain. The most important case, in the choice of components, for the circuit illustrated in FIG. 1 is the case where the ratio of the resistors 28 and 30 connected to the non-inverting input of op-amp 12 is identical to the ratio of the resistors 24 and 26 connected to the inverting input. In this case, the voltage at the output of the difference amplifier is the ratio of the resistance of resistor 26 to the resistance of resistor 24 multiplied by the difference between the voltages at the input.

One problem with prior art implementations of difference amplifiers such as illustrated in FIG. 1 occurs when there is a large common-mode voltage applied to the input terminals. Due to performance limitations of the components which are used in the op-amp, the non-inverting input of the amplifier may be driven to a voltage that is beyond its allowable common-mode operating range (either positive or negative depending on the design of the particular amplifier). At voltages greater than the common-mode operating range of the amplifier, the difference amplifier ceases to function properly. A "break-through" or "feed-through" voltage may be generated that will feed through the feedback resistors connected to the inverting input of the difference amplifier and show up at the output of the difference amplifier. This feed through voltage will result in an error in response to differential-mode signals between the input terminals, as well as adversely affecting other circuits which may be connected to the output of the difference amplifier.

Another problem with the difference amplifier shown in FIG. 1 occurs when the operational amplifier is powered by a single polarity power supply. In this case, the output of the differential amplifier cannot be driven to an opposite polarity voltage and, in fact, due to limitations of the components within the op-amp, in actual practice, the output of the amplifier cannot be driven fully to the ground (or zero) voltage. Therefore, the difference amplifier cannot respond to bipolar input voltages. That is, since the output of the difference amplifier cannot be driven negative when a positive polarity power supply is used, the difference amplifier cannot reflect a change in the difference between the voltages applied at the non-inverting and inverting inputs when the voltage applied to the inverting input becomes larger and more negative than the voltage applied to the non-inverting input.

A third problem with the prior art implementation of a difference amplifier occurs when the common-mode voltage applied to both inputs of the difference amplifier is not a DC voltage, but is a voltage which has a significant amount of high frequency energy. A high-frequency common-mode voltage may interfere with the desired response of the difference amplifier to the differential-mode signal.

Therefore, an object of the present invention is to provide a difference amplifier apparatus in which there is a reduced effect on the output of the difference amplifier due to a common-mode signal that is much larger than the differential voltage of interest.

Another object of the invention is to provide a difference amplifier apparatus that operates from a single polarity power supply and that can respond to bipolar input voltages.

Still another object of the invention is to provide a difference amplifier apparatus capable of rejecting common-mode voltages that are higher than the power supply voltage.

A further object of the invention is to provide a difference amplifier apparatus in which different gains can can be provided by using a combination of positive feedback and negative feedback.

Yet another object of the present invention is to provide a difference amplifier apparatus incorporating the present invention which is manufactured using monolithic integrated circuit technology and is reliable, inexpensive, and easy to manufacture.

SUMMARY OF THE INVENTION

The foregoing and other objects and advantages of the present invention are achieved in a difference amplifier employing a trimmable attenuator network.

The apparatus includes an operational amplifier which has inverting and non-inverting inputs and an output that is a function of the voltage at the inverting and non-inverting inputs. An attenuator network is connected to the operational amplifier. The attenuator network includes circuitry for reducing a common-mode voltage of a first value applied at the input of the attenuator network to a common-mode voltage that is a fraction of the first value at the output terminals of the attenuator network, which voltage is then transmitted to the operational amplifier inputs. The attenuator network includes additional circuitry for reducing a common-mode feed-through voltage of a second value at the inputs of the attenuator network to a common-mode feed-through voltage at the output of the operational amplifier that is a fraction of the second value.

The foregoing and other objects, features, and advantages of the present invention will be more readily understood and apparent from the following detailed description of the invention, which should be read in conjunction with the accompanying drawings, and from the claims which are appended at the end of the detailed description.

DETAILED DESCRIPTION

For purposes of illustration only, and not to limit generality, the present invention will now be explained with reference to its use in a specific difference amplifier integrated circuit. One skilled in the art will recognize that the features and functions of the invention are useful in other types of integrated circuits, as well as in difference amplifier circuits constructed using discrete components.

Figure 1:
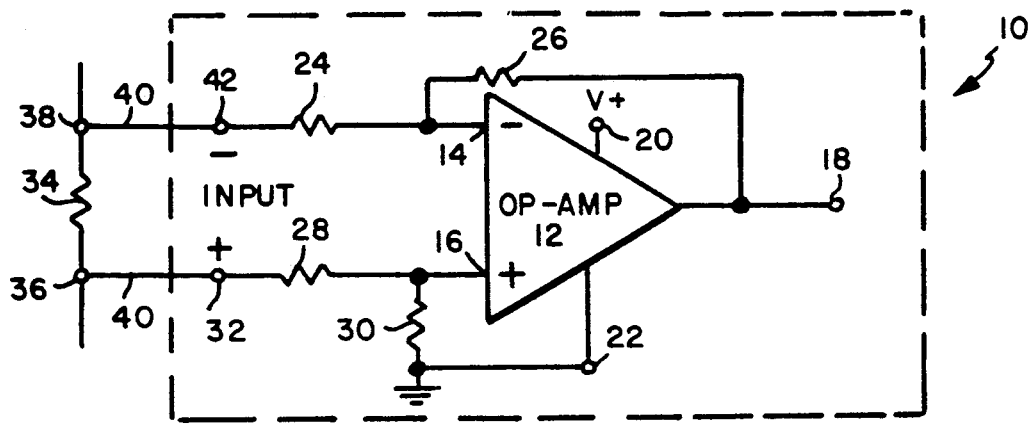
FIG. 1 is a schematic circuit diagram of a prior art implementation of a difference amplifier.

Reference is now made to FIG. 1 which illustrates a typical embodiment of a prior art difference amplifier. Difference amplifier 10 includes a very high gain operational amplifier 12, having an inverting input 14, a non-inverting input 16, and an output terminal 18. Amplifier 12 operates from a power supply (not shown) which provides a voltage at only a single polarity. For illustrative purposes, the polarity is chosen to be positive. Therefore, a power supply terminal 20 is connected to the positive output voltage of the power supply. Power supply terminal 22 is connected to the ground terminal of the power supply.

Difference amplifier 10 additionally includes an input resistor 24 connected to the inverting input 14 of amplifier 12. A feedback resistor 26 is connected from output terminal 18 to input terminal 14. An input resistor 28 is additionally connected to the non-inverting input 16 of amplifier 12. A resistor 30 is connected from the non-inverting terminal 16 of amplifier 12 to a suitable circuit ground. The circuit ground to which resistor 30 is connected may be either an isolated analog signal ground, the power supply ground, or a combination ground.

The input signals for difference amplifier 10 are connected to input terminals 42 and 32. For example, if the difference amplifier is to be used to measure a potential difference across a resistor, such as resistor 34 shown in FIG. 1, the terminal of the resistor which is more positive would be connected to the non-inverting input 32 of difference amplifier 10, and terminal 36 would be connected to input terminal 32, as illustrated by lines 40. In the same manner, the more negative side of the resistor 34, which in the example shown in FIG. 1 is terminal 38, would be connected to the inverting input of difference amplifier 10 at input terminal 42, as shown by line 40. Consequently, in the example shown in FIG. 1, difference amplifier 10 would detect and amplify the potential difference between terminals 36 and 38.

In order for the difference amplifier illustrated in FIG. 1 to operate properly and have the desired zero common-mode response (or infinite common-mode rejection ratio (CMMR)), the ratio of the resistance of resistor 30 to the resistance of resistor 28 must be made identical to the ratio of the resistance of resistor 26 to the resistance of resistor 24. When these resistance ratios are equal, the voltage at output terminal 18 of difference amplifier 10 is the ratio of the resistance of resistor 26 to the resistance of resistor 24 multiplied by the difference between the voltages applied to input terminal 32 and input terminal 42, assuming that the voltage at input terminal 32 is always more positive than the voltage at input terminal 42 (in the case of a difference amplifier powered by a single polarity power supply).

As noted earlier, a problem occurs with the circuit illustrated in FIG. 1 when the common-mode voltage applied to input terminals 32 and 42 is large and particularly when the voltage at terminal 16 exceeds the common-mode voltage range of the amplifier. This problem is bound to occur when the common-mode voltage at terminal 16 is actually higher than the power supply voltage. In the case where the differential-mode voltage is not large enough to result in a net positive voltage at the input to amplifier 12 (after amplification and feedback), there will be a severe common-mode response at terminal 18 due to the fact that the large common-mode voltage will result in a current through resistor 24 and resistor 26, thus making at least a portion of the common-mode voltage appear at the output 18 of amplifier 12. This "feed-through" voltage is greatest when there is no output load on operational amplifier 12. In the case where there is no output load on terminal 18 of operational amplifier 12, the common-mode response of difference amplifier 10 will, in fact, be 100 percent, and the entire common-mode voltage will be present at output terminal 18.

There is a critical ratio of the common-mode voltage to the differential-mode voltage, above which difference amplifier 10 would fail to reject the common-mode voltage and therefore would cease to function properly. The input at the non-inverting terminal 16 of amplifier 12, which is the upper limit of DC common-mode voltage range, is always:

$$V_1 \cdot G/(1+G) \tag{1}$$

where $V_1$ = the voltage at terminal 32 of amplifier 10
$G$ = the gain of amplifier 10 (the ratio of the resistance of resistor 26 to the resistance of resistor 24).

When the voltage at the inverting input 42 of amplifier 10 is incrementally less than the value found in equation 1, the operational amplifier is operating properly by establishing the correct feedback signals through resistor 26. Therefore, the critical point at which the operational amplifier stops amplifying differential-mode signals and allows the common-mode signals to feed-through from input terminal 42 through resistor 24, through resistor 26 and to output terminal 18 occurs when:

$$V_2 = V_1 \cdot G/(1+G) \quad (2)$$

where $V_2$ = the voltage at terminal 42 of amplifier 10.
Since $V_1$ equals the common-mode voltage plus the differential-mode voltage divided by 2:

$$V_1 = V_{cm} + \frac{V_{dm}}{2} \quad (3)$$

where $V_{cm}$ = common-mode voltage
$V_{dm}$ = differential-mode voltage
and $V_2$ equals the common-mode voltage minus one-half the differential-mode voltage:

$$V_2 = V_{cm} - \frac{V_{dm}}{2}. \quad (4)$$

Substituting equations 3 and 4 into equations 1 and 2 and solving gives the result that the ratio of the common-mode voltage to the differential-mode voltage must be less than $G + \frac{1}{2}$. If the common-mode voltage was, for example, 21 V, and the circuit had a gain of 10, any differential-mode signals less than approximately 2 V would not be amplified by the circuit. For one exemplary application of the present invention, the ratio is approximately two hundred times the required sensitivity.

This phenomenon of common-mode feed-through is not to be confused with the common-mode rejection ratio of the amplifier. The common-mode rejection ratio of the amplifier is determined by how closely the values of resistors 24 and 28 and the values of resistors 26 and 30 are respectively matched and becomes a limiting factor to accuracy when the op-amp is operating correctly into a load.

In some applications, a high common-mode voltage must, be rejected by the difference amplifier, even when the common-mode voltage is much higher than the circuit supply voltage. For example, in a particular application of the present invention, the common-mode voltage may be as large as 21V, and the difference amplifier supply voltage may be as low as 5V. Even under the best conditions, this requires that the voltage at the operational amplifier inputs 14,16 cannot exceed 5V. In practice, the operational amplifier input stage must also be able to respond to signals that are only incrementally higher than the ground potential. The design choices are limited and as a result, the highest op-amp input voltage which can still reject a common-mode voltage of 20 V at the operational amplifier terminals is typically only 3.5 V in conventional op-amp designs. Therefore, the gain G must be equal to or lower than 3.5/20, or 1/6, in order to be able to reject a common-mode voltage as high as 20 or 21 V. However, having an overall gain of less than 1, which would be the case with the difference amplifier circuit illustrated in FIG. 10 if the circuit had to reject a common-mode voltage of 21 V and was powered consequently from a supply voltage of 5 V, the gain would consequently be less than 1. A gain less than 1 reduces the usefulness of the circuit in FIG. 1.

Another problem with difference amplifier circuit 10 occurs because of the use of a single polarity power supply. Since amplifier 12 is only powered by a positive power supply, it can only respond to difference signals at its input that are more positive than the ground potential. Consequently, difference amplifier 10 can only respond to positive differential-mode voltages at input terminals 32 and 42. If the voltage at input terminal 42 were to be larger in magnitude than the positive voltage at input terminal 32, difference amplifier 10 would not be able to generate an output proportional to this voltage, since it cannot generate an output voltage below the ground potential of power supply terminal 22.

Figure 2:
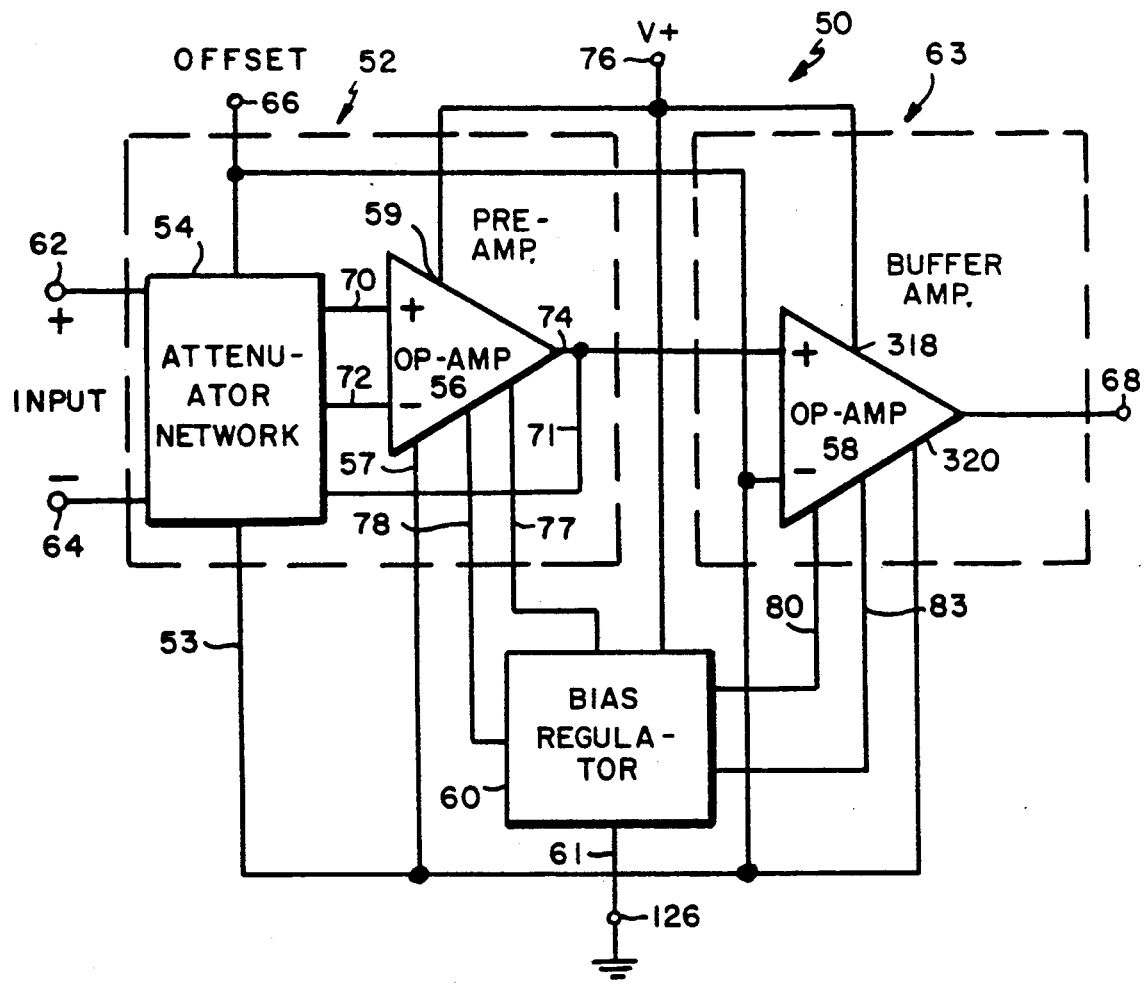
FIG. 2 is a block diagram of the difference amplifier apparatus of the present invention.

Reference is now made to FIG. 2, which shows, in block diagram form, an apparatus according to the present invention, which overcomes the limitations of the difference amplifier illustrated in FIG. 1. Circuit 50 includes a preamplifier stage 52, a second buffer amplifier stage 63, and a bias regulator 60. Preamplifier stage 52 includes input attenuator network 54 and preamplifier 56. Attenuator network 54 is connected to the signals of interest at input terminals 62 and 64. The output of attenuator network 54 is connected to the input terminals 70 and 72 of preamplifier 56. Attenuator network 54 is additionally connected to output terminal 74 of preamplifier 56 via connection 71. The function of attenuator network 54 is to reduce the common-mode voltage at the inputs to preamplifier 56 and to control the input voltages and the feedback circuit for preamplifier 56 in order to provide the desired common-mode "feed-through" rejection ratio and to reduce the common-mode voltage at the inputs to preamplifier 56. Attenuator network 54 additionally includes offset terminal 66 that is used to control preamplifier circuit 52 and buffer amplifier 58 in order to allow difference amplifier circuit 50 to respond to bipolar input signals. The output terminal 74 of preamplifier 56 is connected to the input of buffer amplifier 58. The function of buffer amplifier 58 is to provide a current gain, as well as a variety of gain choices, depending upon the circuit application. The output of difference amplifier circuit 50 is available at output terminal 68 for connection to other circuits. The function of bias regulator 60 is to provide bias signals that are proportional to absolute temperature, in order to control the operating points for preamplifier 56 and buffer amplifier 58. Bias regulator 60 is connected to the power supply positive voltage at terminal 76 and to ground at terminal 61.

Preamplifier 56 and buffer amplifier 58 are connected to the power supply terminal 76 (the power supply, which is not shown, is usually but not necessarily a single polarity positive voltage power supply) at terminals 59 and 318 respectively. The ground terminal 57 of preamplifier 56, the ground terminal 320 of buffer amplifier 58, the ground terminal 61 of bias regulator 60, and the ground terminal 53 of attenuator network 54 are shown illustratively connected to the power supply ground terminal 126. However, one skilled in the art will appreciate that the signal grounds and the power supply grounds may be separated in order to enhance the performance of the circuit.

Figure 3:
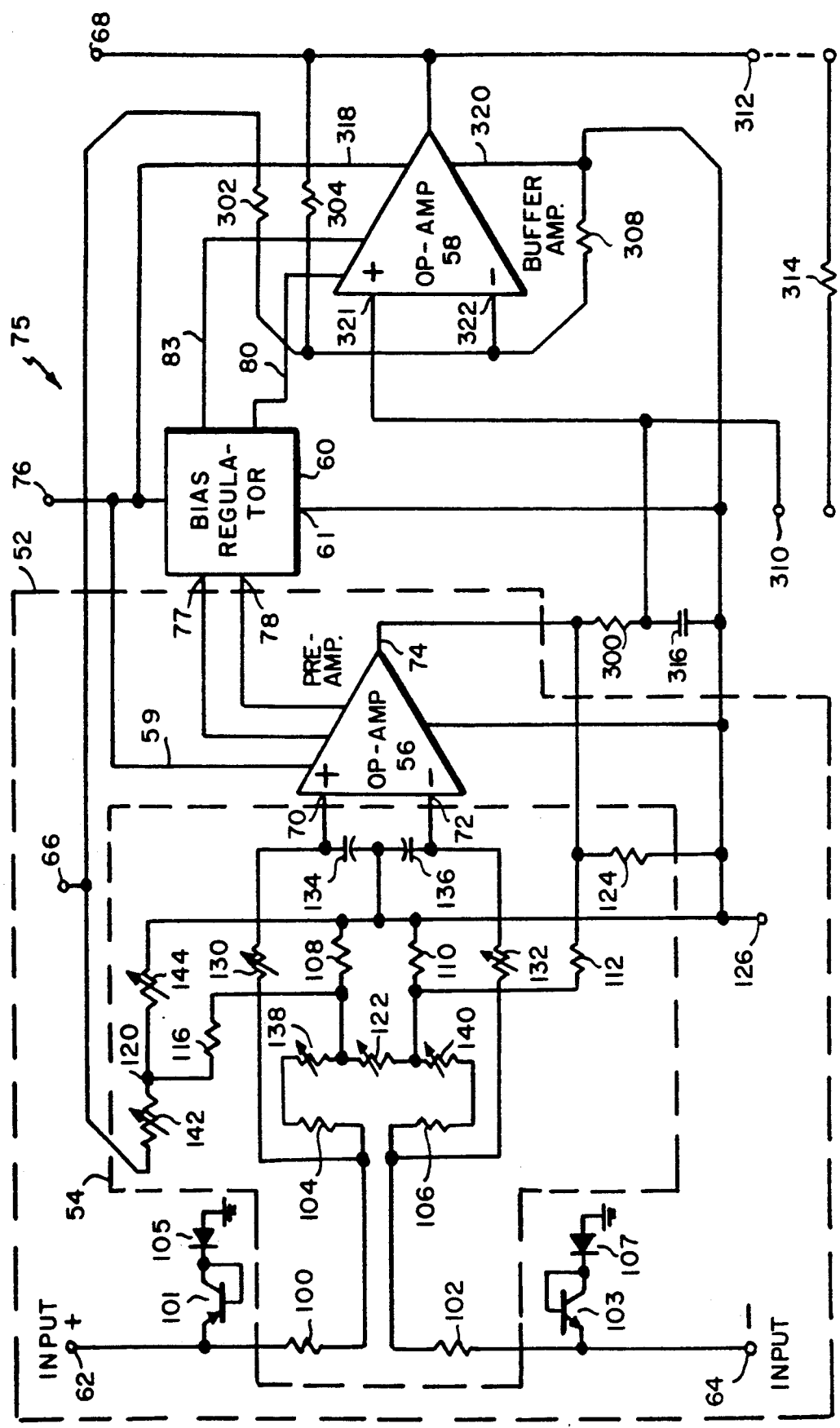
FIG. 3 is a schematic diagram of an illustrative circuit which may be used to perform the functions of the attenuator network illustrated in FIG. 2.

Reference is now made to circuit 75 in FIG. 3, which shows a schematic diagram of an illustrative circuit which may be used to perform the functions of the various functional blocks illustrated in FIG. 2.

The input voltages are applied at input terminals 62 and 64. Special PNP transistors 101 and 102, along with diodes 105 and 107, provide electrostatic discharge protection for the circuit. Input resistors 100 and 102 are the same resistance value and are approximately five times the value of resistors 104 and 106, respectively. Resistors 138 and 140 are used as high resolution trim resistors in order to accurately trim the value of resistors 104 and 106, respectively. Also included in the input signal path are resistors 108 and 110, which are of a low value. In a typical application, resistors 100 and 102 are 200 kOhms, resistors 104 and 106 are 40 kOhms, and resistors 108 and 110 are 250 Ohms. These values are given for exemplary purposes, only. The circuit will operate with other resistor values, depending on the particular input voltages, gain factors, and common-mode voltages in a particular circuit application.

A feedback resistor 112 is provided that connects from the output 74 of operational amplifier 56 to resistor 110 at node 114. The value of the feedback resistor is determined by the value of the feedback factor desired. In a typical application, the overall feedback factor chosen to set the differential gain, G, to 10. In a typical case, therefore, the value of resistor 112 is 10 kOhms. A second resistor, 116, which may have the same value as resistor 112, is connected from node 118 to node 120. The function of this resistor will be described later.

In order to minimize the common-mode voltage response of preamplifier stage 52, all of the passive components connected to the non-inverting terminal of operational amplifier 56 should be respectively matched with all of the components connected to the inverting terminal of operational amplifier 56.

The voltage at the output terminal 74 of difference amplifier 52 is given by the expression:

$$V_o = \frac{gR'}{AR} \cdot (V_{INP} - V_{INN}) \quad (5)$$

where
g is a feedback factor
A is a factor greater than unity
R is the resistance of either of the matched resistors 104 or 106
$V_{INP}$ = the voltage at input terminal 62
$V_{INN}$ = the voltage at input terminal 64
$R' = R + r(g-1)/g$
where r is the resistance of either of the matched resistors 108 or 110.

Using the typical values for components already described, the differential-mode gain is approximately 8. An additional trimmable resistor 122 is added between nodes 114 and 118, in order to increase the gain to 10 by lowering the differential feedback ratio from the output to the input of operational amplifier 56. Resistor 122 can be trimmed in order to adjust the gain without upsetting the common-mode response of the circuit, since it does not affect any of the matched components connected to either the non-inverting input or the inverting input of the amplifier.

Attenuator network 54 prevents the common-mode voltages at the input terminals 70 and 72 of operational amplifier 56 from being any higher than the factor 1/(1+A) multiplied by the common-mode voltage. Therefore, the preamplifier circuit 52 illustrated in FIG. 3, using the typical values, allows the circuit to respond to a peak common-mode voltage of 21 V at the input terminals, while preventing this input voltage from driving the input terminals of operational amplifier 56 to a voltage greater than 3.5 V.

Another object of the present invention is to provide an apparatus that reduces the common-mode response of the circuit due to a common-mode feed-through voltage. In the circuit shown in FIG. 3, the common-mode feed-through path includes, starting at input terminal 64, resistor 102, resistor 106, resistor 140, and resistor 112, so that in the case where the applied common-mode voltage is larger than the common-mode range of operational amplifier 56, the common-mode voltage could feed-through and appear at output terminal 74 of operational amplifier 56. With the typical values of the circuit previously given, the fraction of the common-mode voltage that can feed-through to the output is given by the expression:

$$\frac{r}{(1+A)R} \quad (6)$$

When the typical values are substituted into this expression, this fraction is approximately 0.001. Therefore, the portion of the applied common-mode voltage that can feed-through the feedback path to the output of operational amplifier 56 is approximately 0.001 multiplied by the common-mode voltage. In order to improve this situation, resistor 124 is added, which connects from output terminal 74 of operational amplifier to the ground terminal 126. If resistor 124 has a value of approximately 10 kOhms, the fraction of the common-mode voltage that can feed-through to the output of operational amplifier 56 is reduced by fifty percent to 0.0005. The value chosen for resistor 124 can be adjusted, depending upon the critical threshold value for a particular application, where the common-mode feed-through voltage becomes comparable in magnitude to the differential-mode voltage of interest. Once again, it should be noted that controlling the common-mode "feed-through" voltage is not the same as controlling the common-mode rejection ratio (CMMR). The CMMR is controlled by the accuracy of the match between the values of the respective passive components that are connected to the inverting and non-inverting terminals of operational amplifier 56.

As stated above, another object of the invention is to provide an apparatus that has reduced response to the common-mode signal when the common-mode signal is not a DC voltage, but includes components having high-frequency energy. When the common-mode voltage contains high-frequencies, there is a risk that some residual response to the common-mode signal may interfere with the desired response to the differential-mode signal. In order to overcome this problem, capacitors 134 and 136 are connected from the input terminals of operational amplifier 56 to ground terminal 126. Each of these capacitors form a low-pas network in combination with the resistances of each of the upper and lower legs of attenuator network 54, respectively. If these low-pas networks are unbalanced so that their respective time constants differ, a common-mode signal is converted to a differential-mode signal. Therefore, trim resistors 130 and 132 are also added, in order to slightly increase the time constants of each respective leg of the attenuator network and are selectively adjusted so as to null the common-mode response at high-frequencies. The capacitors also provide radio frequency interference (RFI) protection for the integrated circuit.

Offset terminal 66 is used to introduce an offset voltage at the output terminal 74 of operational amplifier 56 and at the output terminal 68 of operational amplifier 58. Due to the symmetry of the circuit, the gain from offset terminal 66 through resistor 116 to the output terminal 74 of operational amplifier 56 is unity. The offset terminal 66 allows the circuit illustrated in FIG. 3 to process bipolar inputs, that is, differential-mode voltages that swing above and below the voltage on ground terminal 126, while keeping the output of operational amplifier 56 and operational amplifier 58 at a positive voltage. For example, when a positive reference voltage is applied to terminal 66, the output of operational amplifier 56 and operational amplifier 58 will swing exactly one-half the reference voltage above or below the reference voltage. The voltage divider created by trimmable resistors 142 and 144 allows exact setting of the mid-scale offset.

The circuit 75 illustrated in FIG. 3 also includes a bias regulator 60 connected to the power supply voltage at terminal 76. Bias regulator 60 supplies bias voltage and bias current which voltage and current is proportional to absolute temperature in order to set the operating points for operational amplifier 56 and operational amplifier 58. Bias signals are supplied to operational amplifier 56 via connections 77 and 78. Bias signals are supplied to operational amplifier 58 via connections 80 and 83.

Figure 4:
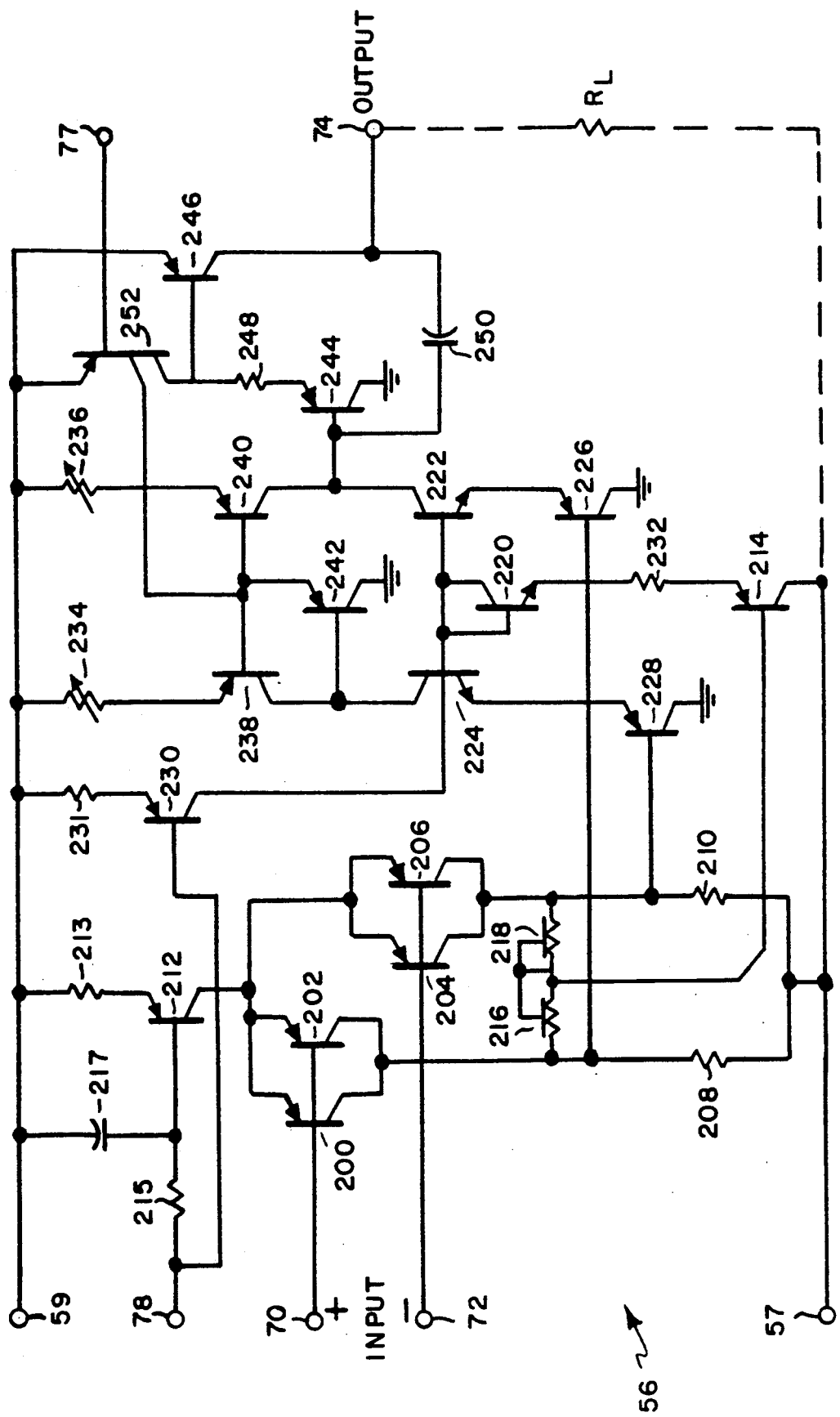
FIG. 4 is a schematic diagram of an illustrative circuit which may be used to perform the functions of the preamplifier illustrated in FIG. 2.

Reference is now made to FIG. 4, which shows a schematic diagram of an illustrative circuit which may be used to perform the functions of preamplifier 56 illustrated in FIG. 3. Operational amplifier 56 is optimized for operation at high closed-loop gains with very low input offset drift and the capability to reject large positive common-mode voltages. It is to be noted that although the transistors in the circuit which have their collectors connected to ground terminal 57 are PNP's, the circuit can be embodied using NPN transistors.

The differential-mode input signals from attenuator network 54 are connected to amplifier input terminals 70 and 72. Transistors 200, 202, 204, 206, along with resistors 208 and 210, form a first voltage amplifier stage. Current for this voltage amplifier stage is supplied by resistor 213 and transistor 212, which is in turn controlled by bias regulator 60 at terminal 78 through resistor 215. The bias current for the voltage amplifier stage will be nominally be proportional to absolute temperature. This choice of bias current minimizes the DC offset errors which may be caused by current imbalances in succeeding stages of operational amplifier 56. Capacitor 217 is used to minimize the coupling of the common-mode voltage present at the emitters of transistors 200, 202, 204, and 206 to bias regulator 60. Without capacitor 217, high frequency common-mode voltages may feed-through bias regulator 60 and appear at the output of buffer amplifier 58.

The voltage gain of the voltage of the first amplifier stage is small, and is limited by the maximum values of the load resistors 208 and 210. The values of load resistors 208 and 210 are chosen in order to maintain the capability of rejecting common-mode voltages on the amplifier inputs which may be very close to the ground potential over the full operating temperature range of the amplifier. In a typical application, resistors 208 and 210 are 30 kOhms. The average voltage at the collectors of transistors 200, 202 and 204, 206 is supplied to the base of transistor 214 through resistors 216 and 218. Resistors 216 and 218 are equal in value and are of a high Ohmic value, that is, much larger than the value of resistors 208 or 210, in order to avoid lowering the voltage gain of the first voltage amplifier stage. For example, resistors 216 and 218 may be pinch resistors with values of 300 kOhms in a typical application.

Transistor 214 operates at a low current and has very low base current, so the voltage drop across resistor 216 or resistor 218 is very small. Consequently, the voltage at the bases of transistors 220, 222, and 224 is approximately two times a base-emitter voltage ($2V_{BE}$) higher than the base voltage of transistor 214. As a result, the quiescent currents in transistors 222, 226 and transistors 224, 228 are proportional to the bias current delivered by resistor 231 and controlled by transistor 230. Transistor 230 is, in turn, controlled by bias regulator 60. The exact value of the proportional relationship depends upon the emitter area ratios chosen for transistors 214, 220, 222, 224, 226, and 228, which transistors provide a second stage of amplification. Resistor 232 is additionally included to further modify the proportionality constant of the quiescent currents in transistors 222, 226 and 224, 228.

The bias current through the second stage amplifier determines the transconductance of that amplifier. This transconductance value is multiplied by the voltage gain of the first stage of the amplifier. Resistors 234, 236, along with transistors 238, 240, and 242, form a current mirror that acts as the load for the second stage amplifier. The collector of transistor 240 drives the output stage, which includes transistors 244 and 246. Transistors 244 and 246 are a Darlington-connected pair and provide the major portion of the gain in operational amplifier 56. To further improve the DC balance of operational amplifier 56 and to keep the input offset voltage and drift to minimal levels, resistor 248 equalizes the voltage at the collectors of transistors 222 and 224. High frequency compensation is provided by capacitor 250. Split-collector transistor 252 supplies bias current that is proportional to absolute temperature, for the Darlington output stage including transistors 244 and 246 and the current mirror including resistors 234 and 236, and transistors 238, 240 and 242.

Returning now to FIG. 3, the output of operational amplifier 56 is connected to the non-inverting input of operational amplifier 58 via resistor 300 to non-inverting input terminal 321 of operational amplifier 58. The function of operational amplifier 58 is to provide a buffer amplifier stage that operates at a lower closed loop gain than operational amplifier 56. Typically, the gain of operational amplifier 58 is approximately 2. The gain of 2 is obtained by the use of resistors 302, 304, and 308 which are fabricated on the integrated circuit. In order to obtain a gain of 2, resistors 302, 304, and 308 all have a value of 20 kOhms.

In other applications, the gain of operational amplifier 58 can be adjusted by the use of an external resistor 314 connected across terminals 310 and 312. Using this configuration, the gain is doubled when the resistance of resistor 314 is twice the resistance of resistor 300. Thus, a combination of positive and negative feedback may be used to adjust the gain of operational amplifier 58. Filter capacitor 316 in combination with resistor 300 provides a low-pas filter.

Figure 5:
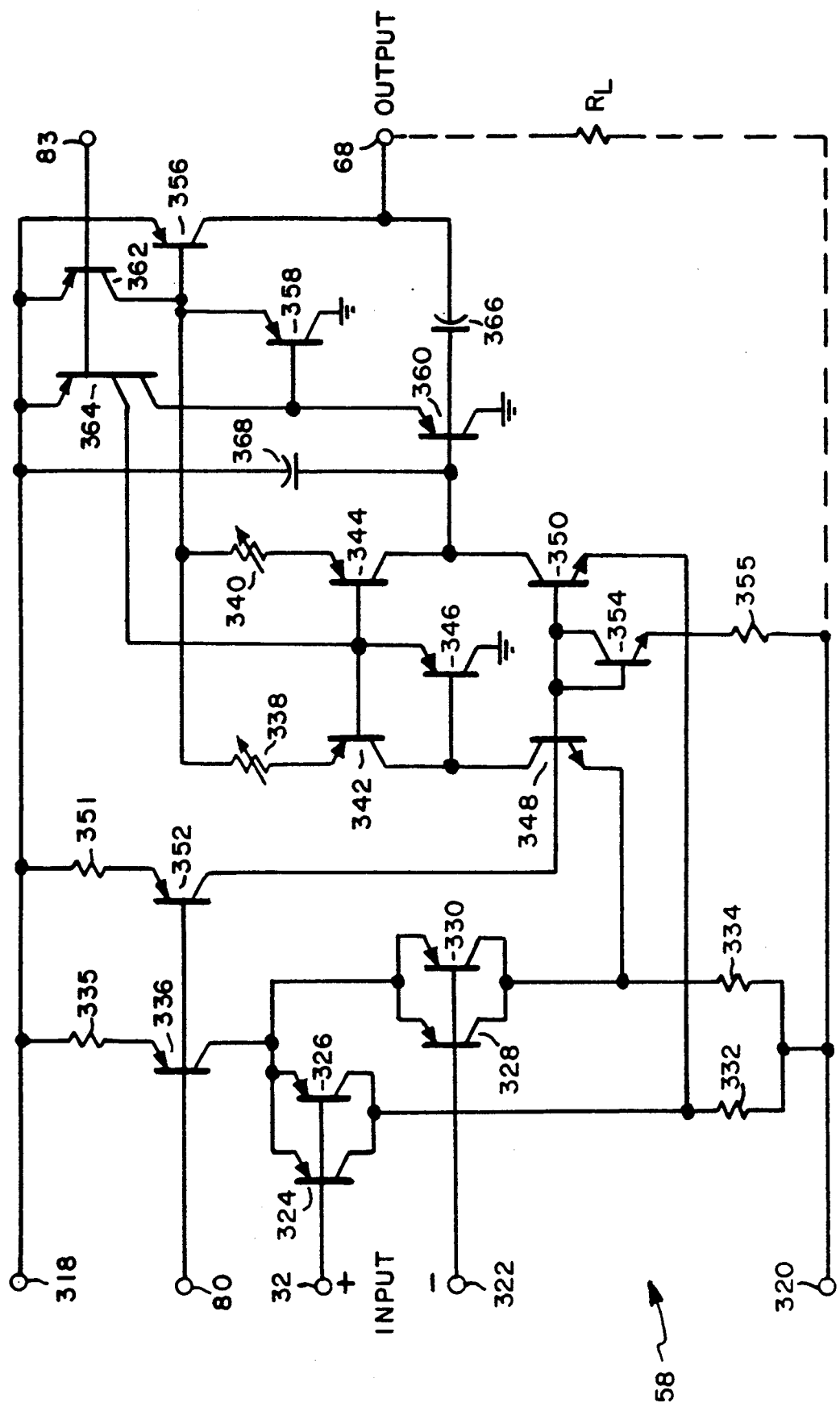
FIG. 5 is a schematic diagram of an illustrative circuit which may be used to perform the functions of the buffer amplifier illustrated in FIG. 2.

Reference is now made to FIG. 5, which shows a schematic diagram of an illustrative circuit which made be used to perform the functions of operational amplifier 58 illustrated in FIG. 3.

The output of operational amplifier 56 is connected to the non-inverting terminal 321 of amplifier 58 shown in FIG. 5. Feedback signals and offset voltages are connected to the inverting input of operational amplifier 58 at terminal 322. A first voltage amplifier stage is formed by transistors 324, 326 and transistors 328, 330, along with resistors 332 and 334. Bias current for this voltage amplifier stage is provided through resistor 335 and controlled by transistor 336, which receives bias power at its base from terminal 80, which bias power is proportional to absolute temperature. This first voltage amplifier stage operates in a similar manner to the first voltage amplifier stage described in connection with operational amplifier 56. This amplifier stage can operate with positive common-mode voltages ranging from ground to approximately 1.5 V below the positive power supply in the worst case. The outputs of this voltage amplifier stage at the collectors of transistors 324, 326 and 328, 330 are loaded by a second amplifier stage which includes a current mirror formed by resistors 338, 340, along with transistors 342, 344, and 346. Between the second-stage current mirror and the first-stage voltage amplifier are transistors 348 and 350, which are connected in a folded cascode circuit. Transistor 352 controls the current from resistor 351 to provide bias power that is proportional to absolute temperature for the cascode circuit. Diode-connected transistor 354 and resistor 355 are used to establish appropriate bias currents in transistors 348 and 350 while ensuring accurate control of the voltages across resistors 332 and 334.

Cascode-connected transistors 348 and 350 do not provide any voltage or current gain, but simply provide the required common-mode range at the amplifier input. The current gain of the second amplifier stage is actually less than 1, because some of the signal current provided by the first stage amplifier is dissipated between the emitter impedances of transistors 348, 350 and the first stage pulldown resistors 332 and 334. Consequently, the DC balance of the current mirror in amplifier 58 is more important than in amplifier 56.

Biasing transistor 364 provides bias current to the current mirror that includes resistors 338, 340 along with transistor 342, 344, and 346. The output of the current mirror, at the collector of transistor 344, is used to drive the base of transistor 360, which is connected to transistors 358 and 356 in a triple-Darlington configuration. High-frequency compensation is provided by capacitors 366 and 368.

To compensate for the lack of gain of the second amplifier stage, the afore-said triple-Darlington output stage, having very high voltage and current gain is used. Any voltage variation in the base of transistor 356 is transmitted equally to the collector of transistor 348 via resistor 340, transistor 344 and transistor 346, and to the collector of transistor 350 via transistors 360 and 358. Consequently, the effective voltage gain of the triple-Darlington output stage, as well as its current gain, is very high. Equal bias currents for output transistors 358 and 360 are provided by biasing transistor 362 and split-collector biasing transistor 364, respectively, which are in turn connected to bias regulator 60.

The apparatus of the present invention provides, in a monolithic integrated circuit configuration, a difference amplifier that is able to operate from a single polarity power supply and still process bipolar input signals, as well as being able to reject common-mode voltages which are larger than the supply voltage, and at the same time minimizing the effect of common-mode voltage feed-through voltages.

Having thus described one particular embodiment of the invention, various alterations, modifications and improvements will readily occur to those skilled in the art. Such alterations, modifications and improvements as are made obvious by this disclosure are intended to be part of this disclosure, although not expressly stated, and are intended to be within the spirit and scope of the invention. For example, one skilled in the art will realize that the circuit of the present invention can be adjusted for applications in which the ratio of common-mode voltage to differential-mode voltage is different than the particular example illustrated. Further, one skilled in the art will recognize that the present invention can be embodied in integrated circuits as well as in circuits using discrete components. Accordingly, the foregoing description is by by way of example only, and is not intended as limiting. The invention is limited only as defined in the following claims and the equivalents thereto.

What is claimed is:

1. A difference amplifier apparatus adapted to respond to a differential voltage, reject a common-mode voltage, and reduce a common-mode feed-through voltage, comprising:

an operational amplifier having an inverting input terminal, a non-inverting input terminal and an output terminal wherein a voltage at the output terminal is a function of a voltage at the inverting input terminal and a voltage at the non-inverting input terminal; and attenuator means having first and second input terminals and first and second output terminals wherein the first and second outputs terminals are connected to the inverting input terminal and the non-inverting input terminal of the operational amplifier respectively, the attenuator means including circuit means for reducing the common-mode voltage having a first value at the first and second input terminals to a common-mode voltage that is a fraction of the first value at the first and second output terminals, the attenuator means including circuit means for reducing the common-mode voltage having the first value at the first and second input terminals to a common-mode feed-through voltage that is a fraction of the first value at the output terminal of the operational amplifier, the attenuator means including circuit means, coupling between the non-inverting input terminal and the inverting terminal of the operational amplifier, for adjusting a differential gain of the operational amplifier without affecting a common-mode response of the difference amplifier.

2. The difference amplifier of claim 1, further comprising:

a secoind operational amplifier having a second inverting input terminal, a secoind non-inverting input terminal, and a second output terminal wherein a voltage at the second output terminal and a voltage at the second non-inverting terminal, the second operational amplifier having the second, non-inverting terminal coupled to the output terminal of the operational amplifier.

3. The difference amplifier of claim 2, further comprising:

a bias regulator means, coupled to the operational amplifier and the second operational amplifier, for supplying bias which is proportional to absolute temperature.

4. The difference amplifier of claim 3, wherein the bias regulator means, the operational amplifier means, and the second operational amplifier are powered by a single polarity power supply.

5. The difference amplifier of claim 4, further comprising:

a low-pass filter means coupling the output of the operational amplifier to the non-inverting input of the second operational amplifier.

6. The difference amplifier of claim 2, further comprising:
   means for controlling a gain of the second operational amplifier comprising negative feedback means, coupled between the second output terminal and the second inverting input terminal, for providing a negative feedback signal, and positive feedback means, coupled between the second output terminal and the second non-inverting input terminal, for providing a positive feedback signal.

7. The difference amplifier of claim 2, further comprising:
   an offset control means, coupled to the attenuator means and to the inverting input of the second operational amplifier means, for determining an output voltage when no differential signal is present at the input to the attenuator means.

8. A difference amplifier which may be powered by a single polarity power supply and adapted to respond to a differential voltage, reject a common-mode voltage, and reduce a common-mode feed-through voltage, comprising:
   a first operational amplifier stage including a first output, a first inverting input, and a first non-inverting input;
   a second operational amplifier stage including a second output, a second inverting input, and a second non-inverting input and having the second non-inverting input coupled to the first output; and
   an attenuator stage, having third and fourth inputs and third and fourth outputs, the third and fourth outputs respectively coupled to the first inverting and non-inverting inputs, the attenuator stage including respectively matched components coupling between the third and fourth inputs and the third and fourth outputs, the attenuator stage including means for reducing the common-mode voltage having a first value at the third and fourth inputs to a common-mode voltage that is a fraction of the first value at the third and fourth outputs, the attenuator stage further including means, including an additional resistor coupled between the first output and a ground, for reducing the common-mode voltage having the first value at the third and fourth inputs to a common-mode feed-through voltage that is a fraction of the first value at the first output, while maintaining a high common-mode rejection ratio.

9. The difference amplifier of claim 8, further comprising capacitor means respectively coupled between the first inverting and non-inverting inputs and a ground for reducing response to common-mode signals having high-frequency energy.

10. The difference amplifier of claim 9, wherein the first operational amplifier stage includes a first low-gain voltage amplifier having an output coupled to a first high-gain voltage amplifier.

11. The difference amplifier of claim 10, wherein the first high-gain voltage amplifier includes a current mirror circuit coupled to a Darlington-connected pair of transistors.

12. The difference amplifier of claim 11, wherein the second operational amplifier stage includes a second low-gain voltage amplifier having an output coupled to a second high-gain voltage amplifier.

13. The difference amplifier of claim 12, wherein the second high-gain voltage amplifier includes a current mirror circuit coupled to a triple-Darlington connected group of transistors.

14. The difference amplifier of claim 8, further comprising:
   an offset control means, coupled to the attenuator stage and to the second operational amplifier stage, for determining an output voltage when no differential voltage is present at the input to the attenuator stage.

15. A difference amplifier which may be powered by a single polarity power supply and adapted to respond to a differential voltage, reject a common-mode voltage, and reduce a common-mode feed-through voltage, comprising:
   a first operational amplifier stage including a first output, a first inverting input, and a first non-inverting input;
   a second operational amplifier stage including a second output, a second inverting input, and a second non-inverting input and having the second non-inverting input coupled to the first output;
   an attenuator stage, having third and fourth inputs and third and fourth outputs, the third and fourth outputs respectively coupled to the first inverting and non-inverting inputs, the attenuator stage including respectively matched components coupling between the third and fourth inputs and the third and fourth outputs, the attenuator stage including means for reducing the common-mode voltage having a first value at the third and fourth inputs to a common-mode voltage that is a fraction of the first value at the third and fourth outputs, the attenuator stage including means for reducing the common-mode voltage having the first value at the third and fourth inputs to a common-mode feed-through voltage that is a fraction of the first value at the first output, while maintaining a high common-mode rejection ratio; and
   means, coupling between the non-inverting input and the inverting input of the first operational amplifier stage, for adjusting a differential gain of the first operational amplifier stage without affecting a common-mode response of the difference amplifier.

* * * * *